United States Patent
Yamamoto et al.

(10) Patent No.: US 10,411,673 B2
(45) Date of Patent: *Sep. 10, 2019

(54) QUARTZ CRYSTAL BLANK AND QUARTZ CRYSTAL RESONATOR UNIT

(71) Applicant: Murata Manufacturing Co., Ltd., Nagaokakyo-shi, Kyoto-fu (JP)

(72) Inventors: Hiroyuki Yamamoto, Nagaokakyo (JP); Hiroaki Kaida, Nagaokakyo (JP); Masaru Asai, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/924,826

(22) Filed: Mar. 19, 2018

(65) Prior Publication Data

US 2018/0212587 A1 Jul. 26, 2018

Related U.S. Application Data

(63) Continuation of application No. PCT/JP2016/077964, filed on Sep. 23, 2016.

(30) Foreign Application Priority Data

Sep. 30, 2015 (JP) .................................. 2015-193541

(51) Int. Cl.
*H03H 9/19* (2006.01)
*H03H 3/02* (2006.01)
(Continued)

(52) U.S. Cl.
CPC .............. *H03H 9/19* (2013.01); *H03H 3/02* (2013.01); *H03H 9/02023* (2013.01);
(Continued)

(58) Field of Classification Search
CPC ........... H03H 9/02023; H03H 9/02157; H03H 9/0509; H03H 9/0519; H03H 3/02;
(Continued)

(56) References Cited

U.S. PATENT DOCUMENTS 8,994,252 B2 3/2015 Nakanishi
9,985,604 B2 * 5/2018 Yamamoto ............... H03H 9/19
(Continued)

FOREIGN PATENT DOCUMENTS

JP H07-183759 A 7/1995
JP 2000-267888 A 11/2009
(Continued)

OTHER PUBLICATIONS

International Search Report issued in International Application No. PCT/JP2016/077964, dated Dec. 13, 2016.
(Continued)

*Primary Examiner* — J. San Martin
(74) *Attorney, Agent, or Firm* — Arent Fox LLP

(57) ABSTRACT

A rectangular quartz crystal blank having long sides substantially parallel to a Z' axis of the quartz crystal blank, and short sides substantially parallel to an X axis of the quartz crystal blank. The quartz crystal blank includes a center region, a second region and a third region that are adjacent to the center region along a long-side direction, and a fourth region and a fifth region that are adjacent to the first region along a short-side direction. A thickness of the second region and a thickness of the third region are smaller than a thickness of the first region, and/or a thickness of the fourth region and a thickness of the fifth region are smaller than a thickness of the first region, and $16.21 \leq W/T \leq 17.71$, where W is a length of a short side and T is a thickness.

16 Claims, 13 Drawing Sheets

(51) Int. Cl.
  *H03H 9/10* (2006.01)
  *H03H 9/02* (2006.01)
  *H03H 9/05* (2006.01)
  *H03H 9/17* (2006.01)

(52) U.S. Cl.
  CPC ...... *H03H 9/02157* (2013.01); *H03H 9/0519* (2013.01); *H03H 9/0552* (2013.01); *H03H 9/10* (2013.01); *H03H 9/1021* (2013.01); *H03H 9/177* (2013.01); *H03H 2003/022* (2013.01)

(58) Field of Classification Search
  CPC .. H03H 3/04; H03H 9/13; H03H 9/19; H03H 9/1021
  See application file for complete search history.

(56) References Cited

U.S. PATENT DOCUMENTS

| | | | | |
|---|---|---|---|---|
| 10,027,309 B2 * | 7/2018 | Yamamoto | ............... | H03H 9/19 |
| 10,135,420 B2 * | 11/2018 | Ibaragi | ............... | H03H 3/02 |
| 2013/0009521 A1 | 1/2013 | Nakanishi | | |
| 2018/0114893 A1 * | 4/2018 | Sato | ............... | H01L 41/047 |
| 2018/0167050 A1 * | 6/2018 | Yoshii | ............... | H03H 9/1021 |
| 2018/0212585 A1 * | 7/2018 | Yamamoto | ............... | H03H 9/19 |

FOREIGN PATENT DOCUMENTS

| | | | |
|---|---|---|---|
| JP | 2013-34176 A | 2/2013 | |
| JP | 2015-170966 A | 9/2015 | |
| WO | WO-2007037455 A1 * | 4/2007 | ......... H03H 9/02086 |

OTHER PUBLICATIONS

Written Opinion of the International Searching Authority issued in International Application No. PCT/JP2016/077964, dated Dec. 13, 2016.

* cited by examiner

US 10,411,673 B2

QUARTZ CRYSTAL BLANK AND QUARTZ CRYSTAL RESONATOR UNIT

CROSS REFERENCE TO RELATED APPLICATIONS

The present application is a continuation of International application No. PCT/JP2016/077964, filed Sep. 23, 2016, which claims priority to Japanese Patent Application No. 2015-193541, filed Sep. 30, 2015, the entire contents of each of which are incorporated herein by reference.

FIELD OF THE INVENTION

The present invention relates to an AT-cut quartz crystal blank and a quartz crystal resonator unit.

BACKGROUND OF THE INVENTION

As reduction in size of a quartz crystal resonator unit has been demanded in recent years, it is necessary to reduce the size of a quartz crystal blank. However, when the size of a quartz crystal blank is reduced, the influence of a sub-vibration becomes pronounced or an influence of vibration leakage arises, and therefore series resistance tends to increase. Examples of existing inventions related to a quartz crystal blank and aimed at reduction of series resistance include a quartz crystal resonator plate described in Patent Document 1. End portions of the quartz crystal resonator plate are chamfered (beveled). Thus, vibration energy is confined under excitation electrodes, and appropriate series resistance can be achieved.

As described above, regarding a quartz crystal blank, various improvements have been made in order to achieve appropriate series resistance.

Patent Document 1: Japanese Unexamined Patent Application Publication No. 2013-34176

SUMMARY OF THE INVENTION

An object of the present invention is to provide a quartz crystal blank and a quartz crystal resonator unit that can reduce a crystal impedance (CI) value.

A quartz crystal blank according to an aspect of the present invention is an AT-cut quartz crystal blank that is plate-shaped and is rectangular when seen in a direction normal to a main surface. Long sides of the main surface are substantially parallel to a Z' axis of the quartz crystal blank. Short sides of the main surface are substantially parallel to an X axis of the quartz crystal blank. A frequency of a main vibration of the quartz crystal blank is in a range of 30.5 MHz to 37.0 MHz. The quartz crystal blank includes a first region including a center of the main surface when seen in the direction normal to the main surface, a second region and a third region that are adjacent to the first region on both sides in a long-side direction in which the long sides extend, and a fourth region and a fifth region that are adjacent to the first region on both sides in a short-side direction in which the short sides extend. A thickness of the first region is substantially uniform. A thickness of the second region and a thickness of the third region are smaller than the thickness of the first region, and/or a thickness of the fourth region and a thickness of the fifth region are smaller than the thickness of the first region. $16.21 \leq W/T \leq 17.71$ is satisfied, where W is a length of the first region, the fourth region, and the fifth region in the short-side direction, and T is the thickness of the first region.

The present invention is also directed at a quartz crystal resonator unit including the quartz crystal blank.

With the present invention, the CI value can be reduced.

DETAILED DESCRIPTION OF THE PREFERRED EMBODIMENTS (Structure of Quartz Crystal Resonator Unit)

Figure 1:
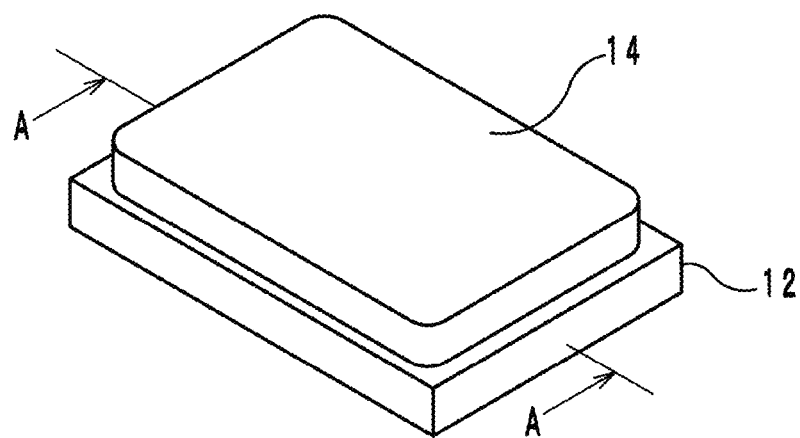
FIG. 1 is an external perspective view of a quartz crystal resonator unit 10.
Figure 1:
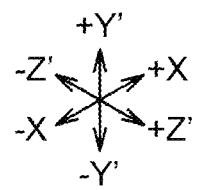
Figure 2:
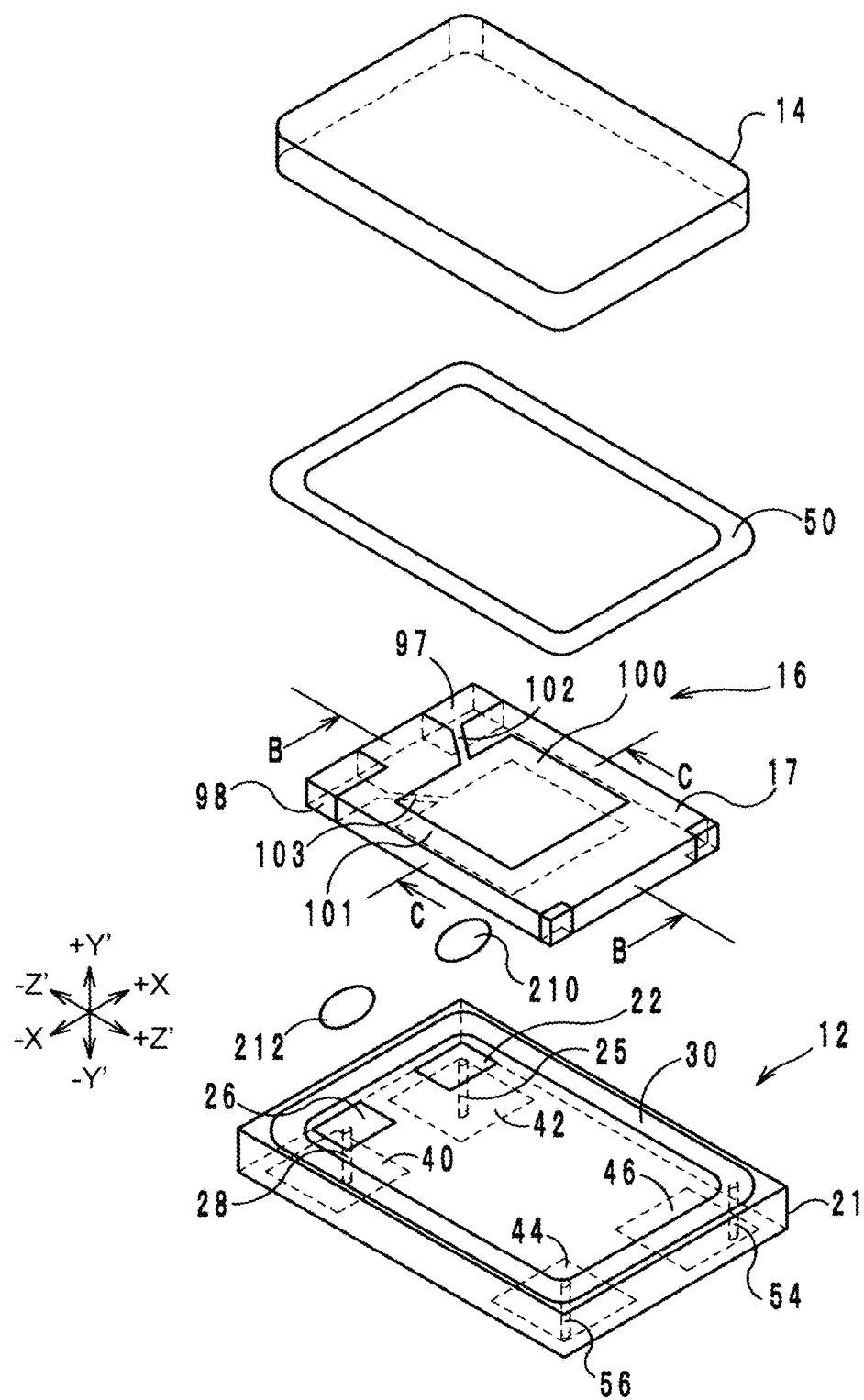
FIG. 2 is an exploded perspective view of the quartz crystal resonator unit 10.
Figure 3:
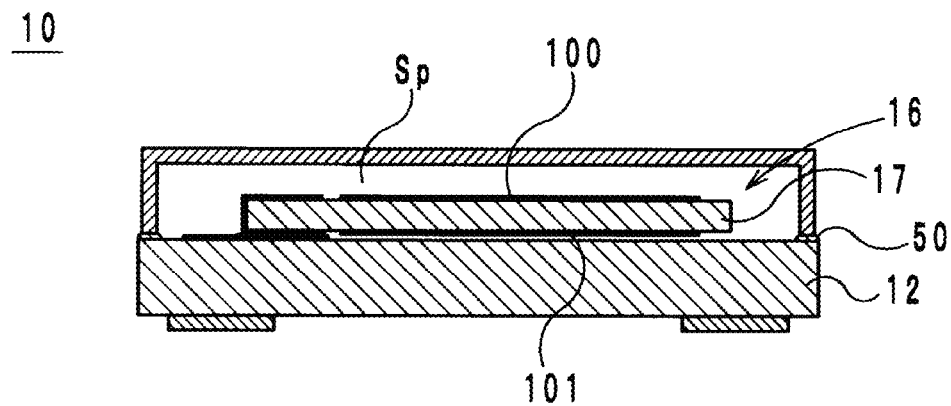
FIG. 3 is a sectional view taken along line A-A of FIG. 1.
Figure 3:
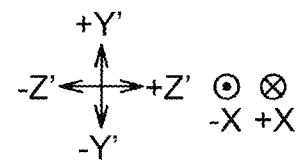

Hereinafter, a quartz crystal resonator unit that includes a quartz crystal blank according to an embodiment of the present invention will be described with reference to the drawings. FIG. 1 is an external perspective view of a quartz crystal resonator unit 10. FIG. 2 is an exploded perspective view of the quartz crystal resonator unit 10. FIG. 3 is a sectional view taken along line A-A of FIG. 1.

Hereinafter, a direction normal to the main surface of the quartz crystal resonator unit 10 is defined as the vertical direction, a direction in which the long sides of the quartz crystal resonator unit 10 extend when seen from above is defined as the long-side direction, and a direction in which the short sides of the quartz crystal resonator unit 10 extend is defined as the short-side direction. Hereinafter, structures may be described with respect to the axial directions of AT cut of a quartz crystal blank 17.

As illustrated in FIGS. 1 to 3, the quartz crystal resonator unit 10 includes a substrate 12, a metal cap 14, a quartz crystal resonator 16, and a brazing alloy 50. The width of the short sides of the quartz crystal resonator unit 10 is 1.6 mm, and the length of the long sides of the quartz crystal resonator unit 10 is 2.0 mm.

The substrate 12 (an example of a circuit substrate) includes a substrate body 21; outer electrodes 22, 26, 40, 42, 44, and 46; via-hole conductors 25, 28, 54, and 56; and a metallized film 30.

The substrate body 21 is plate-shaped and is rectangular when seen from above. The substrate body 21 is made from, for example, a ceramic insulating material, such as an aluminum oxide sintered compact, a mullite sintered compact, an aluminum nitride sintered compact, a silicon carbide sintered compact, or a glass ceramic sintered compact; quartz crystal; glass; silicon; or the like. In the present embodiment, the substrate body 21 is a stack of insulating layers made of a ceramic material. The substrate body 21 has an upper main surface and a lower main surface. The upper main surface (main surface on the +Y' side) of the substrate body 21 will be referred to as the "front surface", and the lower main surface (main surface on the −Y' side) of the substrate body 21 will be referred to as the "back surface".

The outer electrodes 22 and 26 are disposed on an end portion of the front surface of the substrate body 21 in the long-side direction so as to be arranged in the short-side direction. To be specific, the outer electrode 22 is a rectangular conductor layer that is disposed near the corner on the −Z' and +X side of the front surface of the substrate body 21. The outer electrode 26 is a rectangular conductor layer that is disposed near the corner on the −Z' and −X side of the front surface of the substrate body 21.

The outer electrodes 40, 42, 44, and 46 are disposed near the respective corners of the back surface of the substrate body 21. The outer electrode 40 is a square conductor layer that is disposed near the corner on the −Z' and −X side of the back surface of the substrate body 21. The outer electrode 40 overlaps the outer electrode 26 when seen from above. The outer electrode 42 is a square conductor layer that is disposed near the corner on the −Z' and +X side of the back surface of the substrate body 21. The outer electrode 42 overlaps the outer electrode 22 when seen from above. The outer electrode 44 is a square conductor layer that is disposed near the corner on the +Z' and −X side of the back surface of the substrate body 21. The outer electrode 46 is a square conductor layer that is disposed near the corner on the +Z' and +X side of the back surface of the substrate body 21.

The via-hole conductor 25 extends through the substrate body 21 in the vertical direction and connects the outer electrode 22 and the outer electrode 42 to each other. The via-hole conductor 28 extends through the substrate body 21 in the vertical direction and connects the outer electrode 26 and the outer electrode 40 to each other.

The metallized film 30 is a linear metal film disposed on the front surface of the substrate body 21. The metallized film 30 is rectangular-ring shaped when seen from above (in the direction normal to the front surface). The outer electrodes 22 and 26 are disposed in a region surrounded by the metallized film 30 when seen from above.

The via-hole conductor 54 extends through the substrate body 21 in the vertical direction and connects the metallized film 30 and the outer electrode 46 to each other. The via-hole conductor 56 extends through the substrate body 21 in the vertical direction and connects the metallized film 30 and the outer electrode 44 to each other.

The outer electrodes 22, 26, 40, 42, 44, and 46 and the metallized film 30 have a three-layer structure. To be specific, the three-layer structure is formed by stacking a molybdenum layer, a nickel layer, and a gold layer from below. The via-hole conductors 25, 28, 54, and 56 are formed by embedding conductors, such as molybdenum, into via-holes formed in the substrate body 21.

The quartz crystal resonator 16 includes the quartz crystal blank 17, outer electrodes 97 and 98, excitation electrodes 100 and 101, and extension electrodes 102 and 103. The quartz crystal blank 17 is plate-shaped and is rectangular when seen from above. The upper main surface of the quartz crystal blank 17 will be referred to as the "front surface", and the lower main surface of the quartz crystal blank 17 will be referred to as the "back surface".

The quartz crystal blank 17 is an AT-cut quartz crystal blank that is cut from, for example, a rough quartz crystal at a predetermined angle. The long sides of the front surface and the back surface of the quartz crystal blank 17 are substantially parallel to the Z' axis of the quartz crystal blank 17. The short sides of the front surface and the back surface of the quartz crystal blank 17 are substantially parallel to the X axis of the quartz crystal blank 17. Here, "substantially parallel" allows deviation within ±1 degree relative to the Z' axis and the X axis. The quartz crystal blank 17 is beveled, as described below in detail. In each of FIGS. 2 and 3, beveled portions are not illustrated.

The quartz crystal resonator unit is sized so that the length in the long-side direction is 2.0 mm and the width in the short-side direction is 1.6 mm. To achieve this size, in consideration of the thickness of a package wall, bleeding of a molding compound, and the precision of mounting an element, the quartz crystal blank 17 is designed so as have a length of 1.500 mm or smaller in the long-side direction and a width of 1.00 mm or smaller in the short-side direction.

The outer electrode 97 is a conductor layer that is disposed in a region including the corner on the −Z' and +X side of the quartz crystal blank 17. The outer electrode 97 is formed on the front surface and the back surface of the quartz crystal blank 17 and also on side surfaces on the +X side and the −Z' side of the quartz crystal blank 17. The outer electrode 98 is a conductor layer that is disposed in a region including the corner on the −Z' and −X side of the quartz crystal blank 17. The outer electrode 98 is formed on the front surface and the back surface of the quartz crystal blank 17 and also on side surfaces on the −X side and the −Z' side of the quartz crystal blank 17. Thus, the outer electrodes 97 and 98 are arranged along a short side of the quartz crystal blank 17.

The excitation electrode 100 is disposed at the center of the front surface of the quartz crystal blank 17 and is rectangular when seen from above. The excitation electrode 101 is disposed at the center of the back surface of the quartz crystal blank 17 and is rectangular when seen from above. The excitation electrode 100 and the excitation electrode 101 completely overlap each other when seen from above.

The extension electrode 102 is disposed on the front surface of the quartz crystal blank 17 and connects the outer electrode 97 and the excitation electrode 100 to each other. The extension electrode 103 is disposed on the back surface of the quartz crystal blank 17 and connects the outer electrode 98 and the excitation electrode 101 to each other. The outer electrodes 97 and 98, the excitation electrodes 100 and 101, and the extension electrodes 102 and 103 are each formed, for example, by stacking a gold layer on a chrome underlying layer.

The quartz crystal resonator 16 is mounted on the front surface of the substrate 12. To be specific, the outer electrode 22 and the outer electrode 97 are fixed to each other so as to be electrically connected to each other by using an electroconductive adhesive 210, and the outer electrode 26 and the outer electrode 98 are fixed to each other so as to be electrically connected to each other by using an electroconductive adhesive 212.

The metal cap 14 is a housing that has a rectangular opening. The metal cap 14 is made, for example, by plating a base metal, such as an iron-nickel alloy or a cobalt-nickel alloy, with nickel and gold. In the present embodiment, the metal cap 14 is a rectangular-parallelepiped box whose lower side is open. The metal cap 14 is made by plating the surface of a base metal, which is an iron-nickel alloy, with nickel and gold.

The brazing alloy 50 is disposed on the metallized film 30. The brazing alloy 50 has substantially the same shape as the metallized film 30 and is rectangular-ring shaped. The brazing alloy 50 has a melting point lower than that of the metallized film 30 and is made of, for example, a gold-tin alloy. The brazing alloy 50 is formed on the metallized film 30 by, for example, printing or the like. The metallized film 30 is melted and solidified in a state in which the outer edge of the opening of the metal cap 14 is in contact with the brazing alloy 50. Thus, the metal cap 14 is joined to the metallized film 30 via the brazing alloy 50 along the entire length of the outer edge of the opening. As a result, the front surface of the substrate body 21 and the metal cap 14 form a hermetically sealed space Sp. Accordingly, the quartz crystal resonator 16 is contained in the hermetically sealed space Sp. Since the metal cap 14 is in close contact with the substrate body 21 via the metallized film 30 and the brazing alloy 50, the inside of the hermetically sealed space Sp is maintained in a vacuum state. However, the inside may be in an atmospheric state. Instead of the brazing alloy 50, for example, an adhesive made of low-melting-point glass, a resin, or the like may be used. In this case, the metallized film 30 may be omitted.

(Details of Quartz Crystal Blank)

Figure 4:
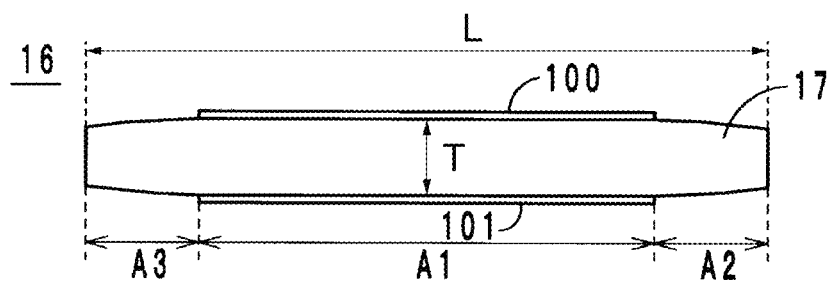
FIG. 4 is a sectional view taken along line B-B of FIG. 2.
Figure 4:
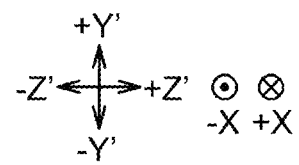
Figure 5:
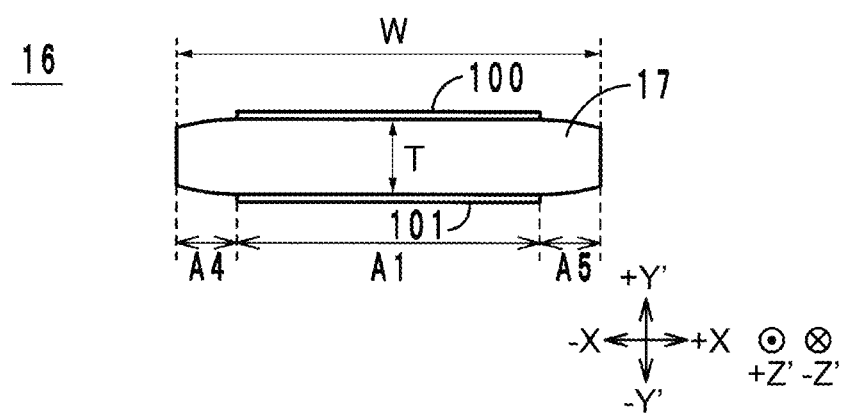
FIG. 5 is a sectional view taken along line C-C of FIG. 2.
Figure 6:
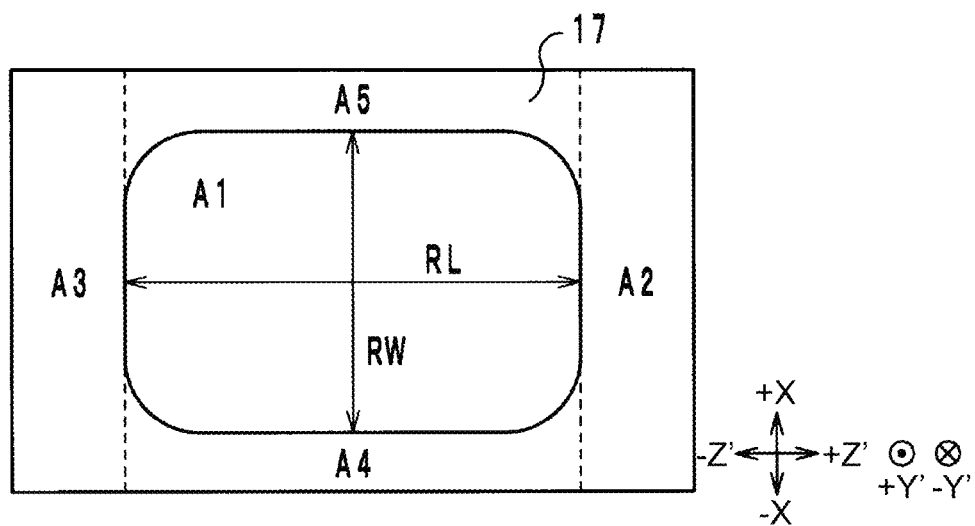
FIG. 6 is a top view of a quartz crystal blank 17.
Figure 7:
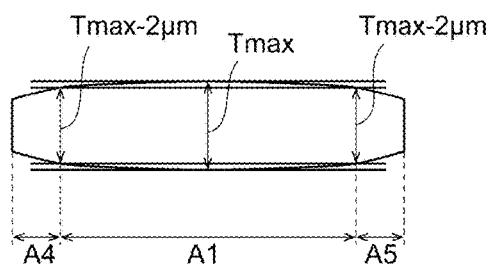
FIG. 7 is a section view of a quartz crystal blank 17.
Figure 7:
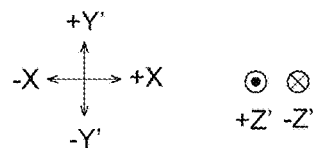

Hereinafter, details of the quartz crystal blank 17 will be described with reference to the drawings. FIG. 4 is a sectional view taken along line B-B of FIG. 2. FIG. 5 is a sectional view taken along line C-C of FIG. 2. FIG. 6 is a top view of the quartz crystal blank 17. FIG. 7 is a section view of the quartz crystal blank 17.

In order to reduce the CI value, the quartz crystal blank 17 according to the present embodiment satisfies the following conditions.

Condition 1: The frequency of a main vibration of the quartz crystal blank 17 is in the range of 30.5 MHz to 37.0 MHz.

Condition 2: The long sides of the front surface and the back surface of the quartz crystal blank 17 are substantially parallel to the Z' axis of the quartz crystal blank 17.

Condition 3: The short sides of the front surface and the back surface of the quartz crystal blank 17 are substantially parallel to the X axis of the quartz crystal blank 17.

Condition 4: The quartz crystal blank 17 is beveled so that, as illustrated in FIGS. 4 and 5, the thickness of portions of the quartz crystal blank 17 near the outer edges of the front surface and the back surface of the quartz crystal blank 17 is smaller than the thickness of a portion of the quartz crystal blank 17 near the centers of the front surface and the back surface of the quartz crystal blank 17.

Condition 5: $16.21 \leq W/T \leq 17.71$ is satisfied, where W is the length of regions A1, A4, and A5 of the quartz crystal blank 17 in the short-side direction, and T is the thickness of the region A1 of the quartz crystal blank 17. The regions A1, A4, and A5 will be described below.

<Regarding Condition 1>

The frequency of the main vibration of the quartz crystal blank 17 depends on the thickness T of the quartz crystal blank 17. Accordingly, the thickness T of the quartz crystal blank 17 is set in the range of 0.0451 mm to 0.0548 mm.

<Regarding Conditions 2 and 3>

In general, a quartz crystal blank is fixed to a substrate by bonding a portion of the quartz crystal blank near a short side thereof to the substrate by using an electroconductive adhesive. Moreover, it is known that the vibration direction of a thickness shear vibration of an AT-cut quartz crystal blank is the X-axis direction. Accordingly, an existing quartz crystal blank whose long sides are parallel to the X axis is likely to influence the substrate due to vibration leakage via the electroconductive adhesive near the short side. In contrast, in the AT-cut quartz crystal blank 17 according to the present embodiment, vibration leakage to a Z' axis region is small, because the long sides are parallel to the Z' axis. Therefore, even when the quartz crystal blank 17 is fixed to the substrate 12 by bonding a portion of the quartz crystal blank 17 near a short side thereof by using the electroconductive adhesives 210 and 212, the influence of vibration leakage on the substrate 12 is small. Accordingly, with the AT-cut quartz crystal blank according to the present embodiment, the influence of vibration leakage is smaller and the CI value is better than a quartz crystal blank whose long sides are parallel to the X axis.

<Regarding Condition 4>

As illustrated in FIG. 6, the quartz crystal blank 17 includes regions A1 to A5 when seen from above. The region A1 is a rectangular region including the center of the front surface when seen from above. However, the shape of the region A1 may be non-rectangular when seen from above and may be, for example, elliptical. The region A2 is a rectangular region adjacent to the region A1 on the +Z' side. The region A2 is in contact with the entirety of a short side of the front surface on the +Z' side and with end portions, in the +Z' direction, of long sides of the front surface on the −X side and +X side. That is, the region A2 is positioned at an end portion of the quartz crystal blank 17 in the +Z' direction. The region A3 is a rectangular region adjacent to the region A1 on the −Z' side. The region A3 is in contact with the entirety of a short side of the front surface on the −Z' side and with end portions, in the −Z' direction, of the long sides of the front surface on the −X side and +X side. That is, the region A3 is positioned at an end portion of the quartz crystal blank 17 in the −Z' direction.

The region A4 is a rectangular region that is adjacent to the region A1 on the −X side and interposed between the regions A2 and A3 from the left and right sides. The region A4 is in contact with a portion, excluding both ends, of a long side of the front surface on the −X side. That is, the region A4 is positioned at an end portion of the quartz crystal blank 17 in the −X direction. The region A5 is a rectangular region that is adjacent to the region A1 on the +X side and interposed between the regions A2 and A3 from the right and left sides. The region A5 is in contact with a portion, excluding both ends, of a long side of the front surface on the +X side. That is, the region A5 is positioned at an end portion of the quartz crystal blank 17 in the +X direction.

As illustrated in FIGS. 4 and 5, the thickness T of the region A1 is substantially uniform. However, the front surface and back surface of the region A1 are slightly curved. Accordingly, as illustrated in FIG. 7, the region A1 that is substantially uniform is a region having a thickness in the range of (Tmax−2 µm) to Tmax, where Tmax is the maximum value of the thickness of the quartz crystal blank in the region A1. The region A1 is a region that includes the center of the front surface and that is continuous. The thickness T of the region A1, which is substantially uniform, has the value Tmax.

As illustrated in FIGS. 4 and 5, the thicknesses of the regions A2 to A5 are smaller than the thickness T of the region A1. In the present embodiment, the thicknesses of the regions A2 to A5 continuously decrease with increasing distance from the region A1. In the present embodiment, the front surfaces and the back surfaces of the regions A2 to A5 are convex surfaces.

<Regarding Condition 5>

$16.21 \leq W/T \leq 17.71$ is satisfied, where W is the length of the regions A1, A4, and A5 of the quartz crystal blank 17 in the short-side direction, and T is the thickness of the region A1 of the quartz crystal blank 17. Preferably, $16.58 \leq W/T \leq 17.25$ is satisfied. More preferably, $17.12 \leq W/T \leq 17.22$ is satisfied.

<Regarding Other Conditions>

Preferably, in addition to the conditions 1 to 5, $0.62 \leq RL/L \leq 0.95$ is satisfied, where L is the length of the regions A1 to A3 in the long-side direction, and RL is the length of the region A1 in the long-side direction; and $0.67 \leq RW/W \leq 0.95$ is satisfied, where RW is the length of the region A1 in the short-side direction. More preferably, $0.62 \leq RL/L \leq 0.74$ is satisfied, where L is the length of the regions A1 to A3 in the long-side direction, and RL is the length of the region A1 in the long-side direction; and $0.67 \leq RW/W \leq 0.79$ is satisfied, where RW is the length of the region A1 in the short-side direction. Further preferably, $0.66 \leq RL/L \leq 0.73$ and $0.70 \leq RW/W \leq 0.78$ is satisfied. Here, the length RL is the length of a portion of the region A1 extending in the long-side direction and passing through a point in the region A1 where the thickness is Tmax. The length RW is the length of a portion of the region A1 extending in the short-side direction and passing through the point in the region A1 where the thickness is Tmax.

(Method of Manufacturing Quartz Crystal Resonator Unit)

Hereinafter, a method of manufacturing the quartz crystal resonator unit 10 will be described with reference to the drawings.

First, a method of manufacturing the substrate 12 will be described. A mother substrate in which a plurality of substrate bodies 21 are arranged in a matrix pattern is prepared. The mother substrate is made from, for example, a ceramic insulating material, such as an aluminum oxide sintered compact, a mullite sintered compact, an aluminum nitride sintered compact, a silicon carbide sintered compact, or a glass ceramic sintered compact; quartz crystal; glass; silicon; or the like.

Next, through-holes are formed by irradiating, with a beam, positions on the mother substrate at which the via-hole conductors 25, 28, 54, and 56 of the substrate body 21 are to be formed. Moreover, the through-holes are filled with an electroconductive material, such as molybdenum, and the electroconductive material is dried. Subsequently, the via-hole conductors 25, 28, 54, and 56 are formed by firing the electroconductive material.

Next, underlying electrodes of the outer electrodes 40, 42, 44, and 46 are formed on the back surface of the mother substrate. To be specific, a molybdenum layer is printed on the back surface of the mother substrate and dried. Subsequently, the molybdenum layer is fired. Thus, the underlying electrodes of the outer electrodes 40, 42, 44, and 46 are formed.

Next, underlying electrodes of the outer electrodes 22 and 26 and the metallized film 30 are formed on the front surface of the mother substrate. To be specific, a molybdenum layer is printed on the front surface of the mother substrate and dried. Subsequently, the molybdenum layer is fired. Thus, the underlying electrodes of the outer electrodes 22 and 26 and the metallized film 30 are formed.

Next, the underlying electrodes of the outer electrodes 40, 42, 44, 46, 22, and 26 and the metallized film 30 are plated with nickel and gold in this order. Thus, the outer electrodes 40, 42, 44, 46, 22, and 26 and the metallized film 30 are formed.

Here, by using a vacuum printing method or the like, it is possible to simultaneously perform filling of the through-holes with the electroconductive material and printing of the outer electrode and the like on the mother substrate. At this time, the electroconductive material, the outer electrodes, and the like are simultaneously fired.

When the mother substrate is made from a ceramic sintered compact insulating material, while the mother substrate is in a sheet shape before being fired, through-holes are formed, the through-holes are filled with the electroconductive material, and the outer electrodes 22, 26, 40, 42, 44, and 46 and the metallized film 30 are printed and dried. Subsequently, a plurality of such sheets are stacked and press-bonded to form a stacked sheet. By firing the stacked sheet, it is possible to simultaneously form the via-hole conductors; the outer electrodes 22, 26, 40, 42, 44, and 46; the metallized film 30; and the substrate body 21. Subsequently, plating is performed in the same way as described above.

Next, the mother substrate is divided into a plurality of substrate bodies 21 by using a dicer. Division grooves may be formed in the mother substrate by irradiating the mother substrate with a laser beam, and then the mother substrate may be divided into a plurality of substrate bodies 21.

Next, a method of manufacturing the quartz crystal resonator 16 will be described. The quartz crystal blank 17, which is rectangular plate-shaped, is obtained by AT-cutting a rough quartz crystal. At this time, the rough quartz crystal is cut so that the long sides of the front surface and the back surface of the quartz crystal blank 17 are substantially parallel to the Z' axis of the quartz crystal blank 17 and the short sides of the front surface and the back surface of the quartz crystal blank 17 are substantially parallel to the X axis of the quartz crystal blank 17.

Next, the quartz crystal blank 17 is beveled by using a barrel finishing apparatus. Thus, ridge portions of the quartz crystal blank 17 are ground, and, as illustrated in FIGS. 4 and 5, the quartz crystal blank 17 has a cross-sectional shape such that the thickness thereof decreases with increasing distance from the center of the front surface.

Next, the outer electrodes 97 and 98, the excitation electrodes 100 and 101, and the extension electrodes 102 and 103 are formed on the quartz crystal blank 17. Since the outer electrodes 97 and 98, the excitation electrodes 100 and 101, and the extension electrodes 102 and 103 can be formed through a general process, the description of the process will be omitted.

Next, the quartz crystal resonator 16 is mounted on the front surface of the substrate body 21. To be specific, as illustrated in FIGS. 2 and 3, the outer electrode 22 and the outer electrode 97 are bonded to each other by using the electroconductive adhesive 210, and the outer electrode 26 and the outer electrode 98 are bonded to each other by using the electroconductive adhesive 212.

Next, the metal cap 14 is attached to the substrate 12 by using the brazing alloy 50. Through the process described above, the quartz crystal resonator unit 10 is completed.

(Advantageous Effects)

With the quartz crystal blank 17 and the quartz crystal resonator unit 10 according to the present embodiment, the CI value can be reduced. To be more specific, as illustrated in FIGS. 4 and 5, the quartz crystal blank 17 has a sectional shape such that the thickness thereof decreases with increasing distance from the center of the front surface. Thus, the vibration energy of the main vibration of the quartz crystal blank 17 is confined in the region A1. The excitation electrodes 100 and 101 are disposed on the region A1. As a result, the main vibration is efficiently converted into an electric signal, and the electric signal is output from the excitation electrodes 100 and 101. Thus, with the quartz crystal blank 17 and the quartz crystal resonator unit 10, the CI value can be reduced.

Figure 8:
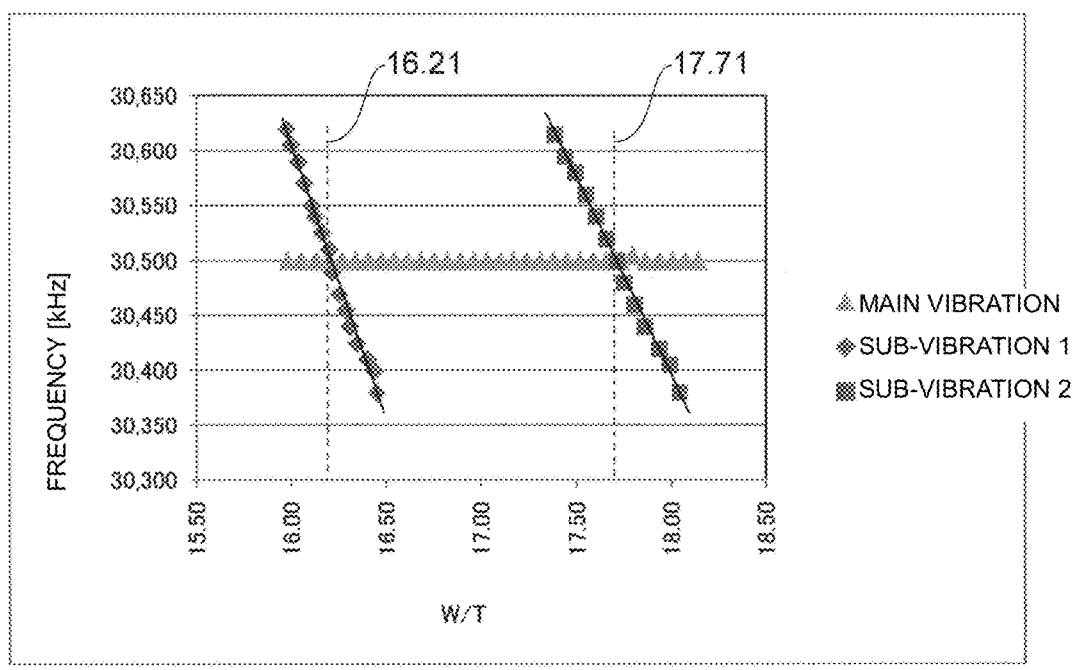
FIG. 8 is a graph representing the relationship between the frequencies of a main vibration and sub-vibrations and W/T of a quartz crystal blank 17 in which the frequency of the main vibration is 30.5 MHz.
Figure 9:
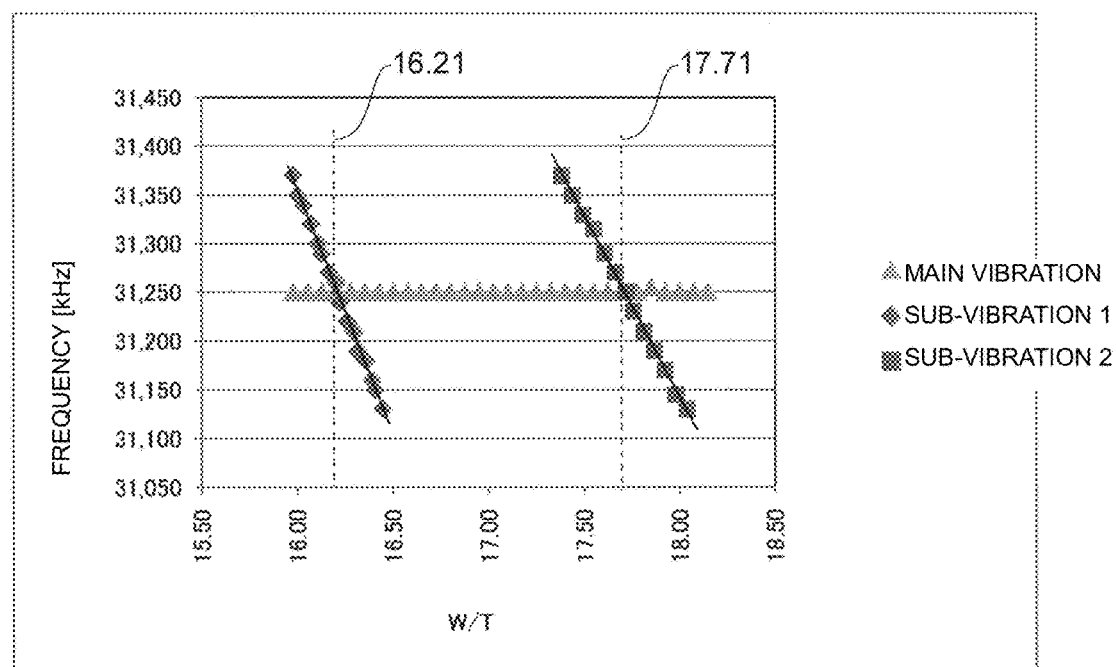
FIG. 9 is a graph representing the relationship between the frequencies of a main vibration and sub-vibrations and W/T of a quartz crystal blank 17 in which the frequency of the main vibration is 31.25 MHz.
Figure 10:
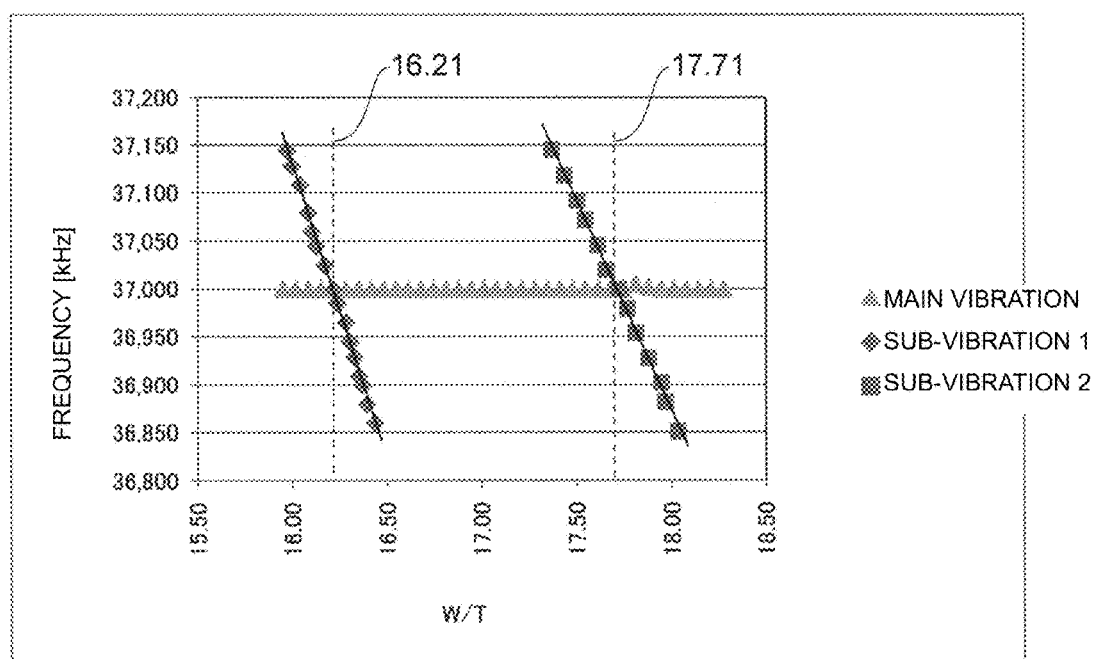
FIG. 10 is a graph representing the relationship between the frequencies of a main vibration and sub-vibrations and W/T of a quartz crystal blank 17 in which the frequency of the main vibration is 37.0 MHz.

With the quartz crystal blank 17 and the quartz crystal resonator unit 10, the CI value can be reduced also for the following reasons. FIG. 8 is a graph representing the relationship between the frequencies of a main vibration and sub-vibrations and W/T of a quartz crystal blank 17 in which the frequency of the main vibration is 30.5 MHz. FIG. 9 is a graph representing the relationship between the frequencies of a main vibration and sub-vibrations and W/T of a quartz crystal blank 17 in which the frequency of the main vibration is 31.25 MHz. FIG. 10 is a graph representing the relationship between the frequencies of a main vibration and sub-vibrations and W/T of a quartz crystal blank 17 in which the frequency of the main vibration is 37.0 MHz. In each of FIGS. 8 to 10, the triangles represent the main vibration, and the squares and the rhombuses represent the sub-vibrations.

In the quartz crystal blank 17 and the quartz crystal resonator unit 10, sub-vibrations occur in addition to a main vibration. The main vibration is a thickness shear vibration. The frequency of the main vibration depends on the thickness T of the quartz crystal blank 17. The sub-vibrations, which are vibrations other than the main vibration, occur due to extension and contraction of the quartz crystal blank 17 in the short-side direction, extension and contraction of the quartz crystal blank 17 in the long-side direction, warping of the quartz crystal blank 17, and the like. The frequencies of the sub-vibrations depend on the length L, the width W, and the like. Such sub-vibrations are so-called spurious vibrations. As can be understood from the results of simulation described below, in which W/T was changed while keeping the length L of the quartz crystal blank 17 in the long-side direction constant, sub-vibrations that may occur in the quartz crystal blank 17 and the quartz crystal resonator unit 10 can be suppressed by adjusting W/T.

Here, the CI value of the quartz crystal blank 17 and of the quartz crystal resonator unit 10 can be reduced by designing the quartz crystal blank 17 and the quartz crystal resonator 16 so as to separate the frequency of the main vibration from the frequencies of the sub-vibrations. The inventors studied the relationship between W/T and the frequencies of the main vibration and the sub-vibrations by performing computer simulation. In the computer simulation, for three types of quartz crystal blanks 17 having main vibration frequencies of 30.5 MHz, 31.25 MHz, and 37.0 MHz, the width W was changed while keeping the thickness T constant. The simulation conditions are as follows.

(1) 30.5 MHz
thickness T: 0.0548 mm
length L: 1.345 mm
length RL: 0.940 mm
RW/W: 0.74
(2) 31.25 MHz
thickness T: 0.0534 mm
length L: 1.345 mm
length RL: 0.940 mm
RW/W: 0.74
(3) 37.0 MHz
thickness T: 0.0451 mm
length L: 1.345 mm
length RL: 0.940 mm
RW/W: 0.74

By performing simulation under the above conditions, the results shown in FIGS. 8 to 10 were obtained. Then, the inventors investigated preferable W/T on the basis of the simulation results.

As can be seen from FIG. 8, when the frequency of the main vibration is 30.5 MHz, the main vibration and sub-vibrations 1 and 2 do not intersect if W/T is in the range of 16.21 to 17.71. That is, if W/T is in the range of 16.21 to 17.71 (that is, T is 0.0548 mm and W is in the range of 0.888 mm to 0.970 mm), the frequency of the main vibration is separated from the frequencies of the sub-vibrations.

As can be seen from FIG. 9, when the frequency of the main vibration is 31.25 MHz, the main vibration and the sub-vibrations 1 and 2 do not intersect if W/T is in the range of 16.21 to 17.71. That is, if W/T is in the range of 16.21 to 17.71 (that is, T is 0.0534 mm and W is in the range of 0.866 mm to 0.947 mm), the frequency of the main vibration is separated from the frequencies of the sub-vibrations.

As can be seen from FIG. 10, when the frequency of the main vibration is 37.0 MHz, the main vibration and the sub-vibrations 1 and 2 do not intersect if W/T is in the range of 16.21 to 17.71. That is, if W/T is in the range of 16.21 to 17.71 (that is, T is 0.0451 mm and W is in the range of 0.732 mm to 0.799 mm), the frequency of the main vibration is separated from the frequencies of the sub-vibrations.

These results show that, when the frequency of the main vibration of the quartz crystal blank 17 is in the range of 30.5 MHz to 37.0 MHz, the frequency of the main vibration is separated from the frequencies of the sub-vibrations if $16.21 \leq W/T \leq 17.71$. Thus, in the quartz crystal blank 17 in which the frequency of the main vibration is in the range of 30.5 MHz to 37.0 MHz, the CI value can be reduced if $16.21 \leq W/T \leq 17.71$.

Since a main vibration and sub-vibrations can be individually analyzed by using simulation, simulation has an advantage in that a range in which the influence of sub-vibrations on a main vibration in the range of 30.5 MHz to 37.0 MHz can be obtained by using the CI value. However, by measuring the CI values of actual samples, although only the CI value in which a main vibration and sub-vibrations are superposed can be obtained, it is possible to obtain detailed measurement results that reflect actual variations in dimensions, shapes, material characteristics, and the like. Therefore, the inventors performed an experiment using samples that were actually made as described below, and obtained a more preferable range of W/T in the frequency range of 30.5 MHz to 37.0 MHz. To be more specific, the inventors made forty pieces of each of first to seventh samples of the quartz crystal resonator unit 10. The conditions for the first to seventh samples are as follows.

First to third samples (frequency of main vibration: 31.25 MHz)

Fourth to seventh samples (frequency of main vibration: 32.0 MHz)

TABLE 1

|         | First Sample | Second Sample | Third Sample |         |
|---------|--------------|---------------|--------------|---------|
| T [mm]  | 0.0534       | 0.0534        | 0.0534       |         |
| L [mm]  | 1.345        | 1.345         | 1.345        |         |
| RL [mm] | 0.940        | 0.940         | 0.940        |         |
| W [mm]  | 0.915        | 0.917         | 0.920        |         |
| RW [mm] | 0.677        | 0.679         | 0.681        |         |
|         | Fourth Sample | Fifth Sample | Sixth Sample | Seventh Sample |
|         | 0.0522       | 0.0522        | 0.0522       | 0.0522  |
|         | 1.350        | 1.350         | 1.350        | 1.350   |
|         | 0.940        | 0.940         | 0.940        | 0.940   |
|         | 0.865        | 0.890         | 0.897        | 0.900   |
|         | 0.652        | 0.671         | 0.676        | 0.694   |

For each of the first to seventh samples, the CI value was measured. In the experiment, the ambient temperature was changed from −30° C. to 85° C. As the CI value, the maximum value for each sample when the temperature was changed from −30° C. to 85° C. was used.

Figure 11A:
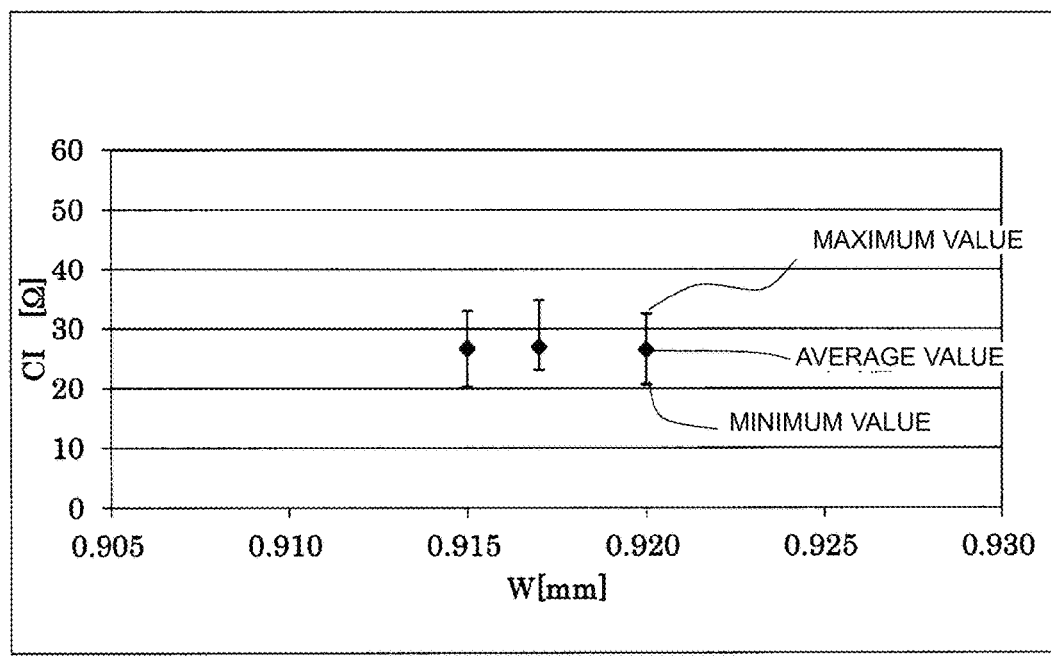
FIG. 11A is graph representing the result of an experiment performed on first to third samples.
Figure 11B:
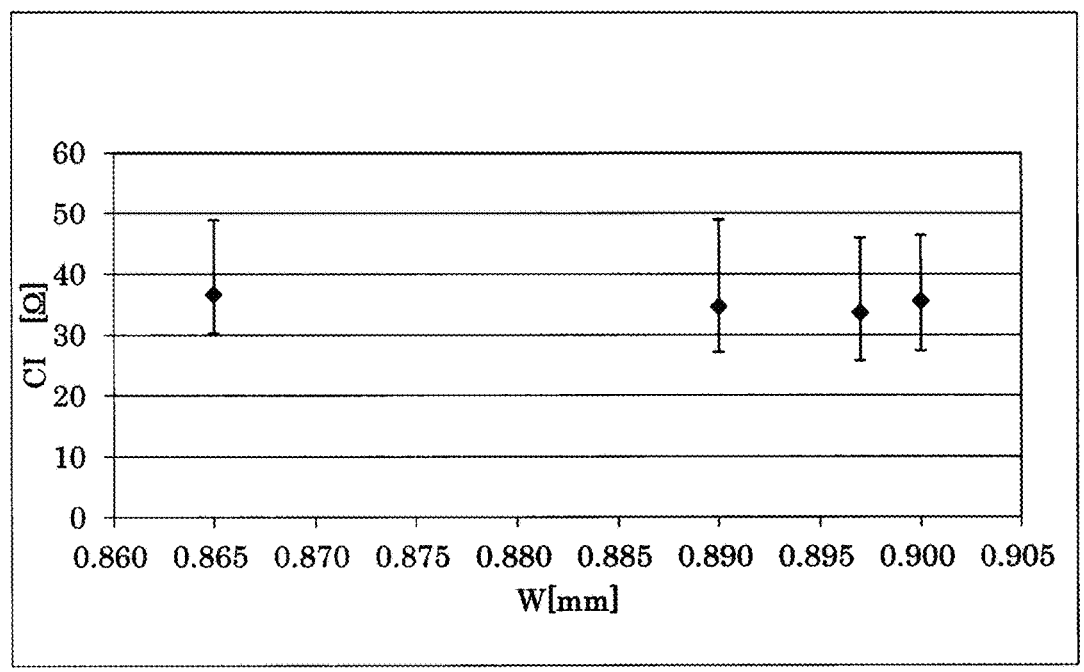
FIG. 11B is graph representing the result of an experiment performed on fourth to seventh samples.

FIG. 11A is a graph representing the result of the experiment performed on the first to third samples (the frequency of the main vibration: 31.25 MHz). FIG. 11B is a graph representing the result of the experiment performed on the fourth to seventh samples (the frequency of the main vibration: 32.0 MHz). In FIGS. 11A and 11B, the vertical axis represents the CI value, and the horizontal axis represents the width W.

FIG. 11A shows measurements of the CI value for W in the range of 0.915 mm to 0.920 mm where the CI value was smaller than or equal to 50Ω in the case where the frequency of the main vibration was 31.25 MHz. Since the thickness T of the quartz crystal blank 17 was 0.0534 mm, W/T was in the range of 17.12 to 17.21. Within this range, the maximum value of the CI value was smaller than or equal to 35Ω and the average value of the CI value was smaller than or equal to 30Ω, each of which was smaller than or equal to 70% of 50Ω and sufficiently low.

As can be seen from FIG. 11B, in the case where the frequency of the main vibration was 32.0 MHz, the CI value was smaller than or equal to 50Ω when W was in the range of 0.865 mm to 0.900 mm. Since the thickness T of the quartz crystal blank 17 was 0.0522 mm, W/T was in the range of 16.57 to 17.24. Within this range, the maximum value of the CI value was smaller than or equal to 50Ω and the average value of the CI value was smaller than or equal to 40Ω, each of which was sufficiently low.

From the above results, preferably, $16.58 \leq W/T \leq 17.25$ is satisfied, and more preferably $17.12 \leq W/T \leq 17.22$, where the average value of the CI value was smaller than or equal to 35Ω, is satisfied.

Next, the inventors performed an experiment as described below and obtained preferable ranges of RL/L and RW/W. To be more specific, forty pieces of each of eighth to fourteenth samples were made. Conditions for the eighth to fourteenth samples were as follows.

Eighth to tenth samples (frequency of main vibration: 31.25 MHz)

Eleventh to fourteenth samples (frequency of main vibration: 32.0 MHz)

TABLE 2

|         | Eighth Sample | Ninth Sample | Tenth Sample |         |
|---------|---------------|--------------|--------------|---------|
| T [mm]  | 0.0534        | 0.0534       | 0.0534       |         |
| L [mm]  | 1.345         | 1.345        | 1.345        |         |
| RL [mm] | 0.890         | 0.940        | 0.990        |         |
| W [mm]  | 0.917         | 0.917        | 0.917        |         |
| RW [mm] | 0.643         | 0.679        | 0.715        |         |
|         | Eleventh Sample | Twelfth Sample | Thirteenth Sample | Fourteenth Sample |
|         | 0.0522        | 0.0522       | 0.0522       | 0.0522  |
|         | 1.350         | 1.350        | 1.350        | 1.350   |
|         | 0.840         | 0.890        | 0.940        | 0.990   |
|         | 0.897         | 0.897        | 0.897        | 0.897   |
|         | 0.604         | 0.640        | 0.676        | 0.712   |

For each of the eighth to fourteenth samples, the CI value was measured. In the experiment, the ambient temperature was changed from −30° C. to 85° C. As the CI value, the maximum value for each sample when the temperature was changed from −30° C. to 85° C. was used.

Figure 12A:
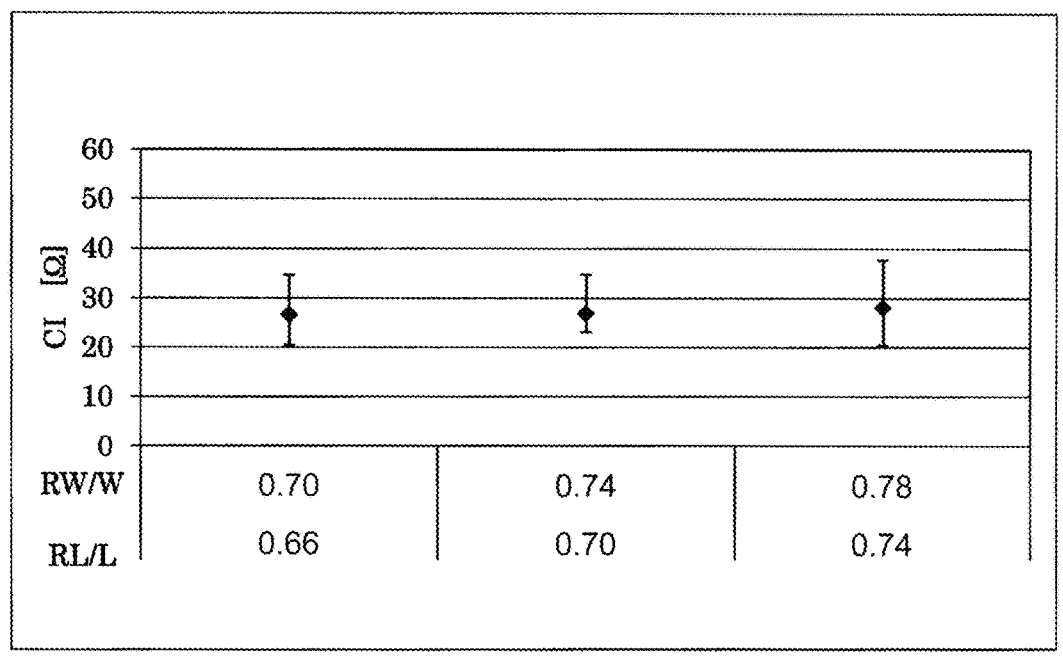
FIG. 12A is graph representing the result of an experiment performed on eighth to tenth samples.
Figure 12B:
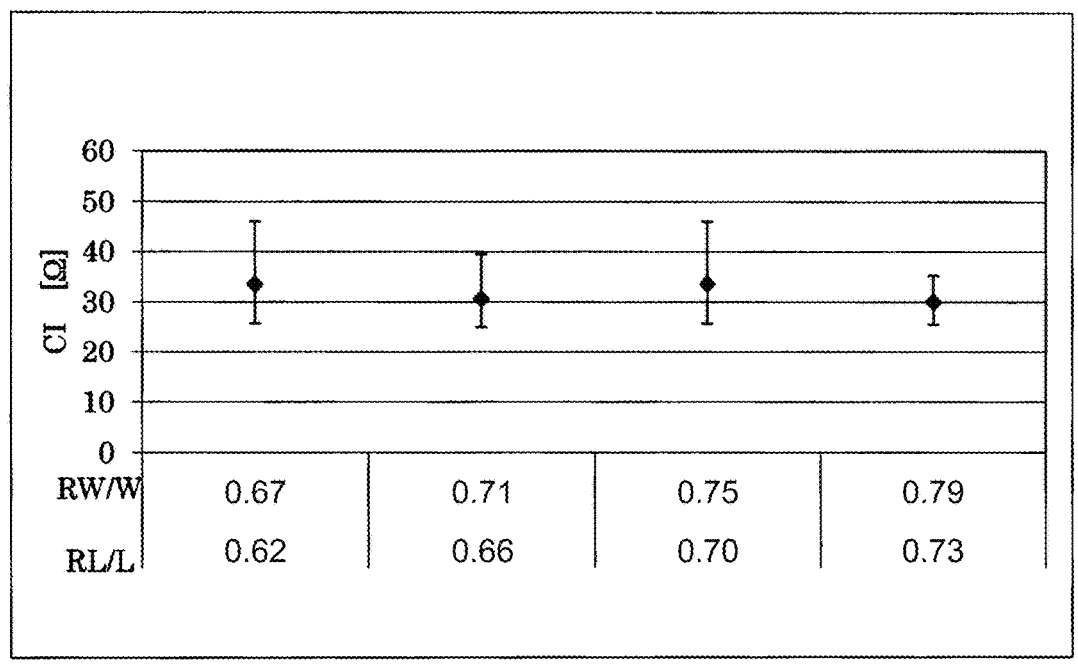
FIG. 12B is graph representing the result of an experiment performed on eleventh to fourteenth samples.

FIG. 12A is a graph representing the result of the experiment performed on the eighth to tenth samples (the frequency of the main vibration: 31.25 MHz). FIG. 12B is a graph representing the result of the experiment performed on the eleventh to fourteenth samples (the frequency of the main vibration: 32.0 MHz). In FIGS. 12A and 12B, the vertical axis represents the CI value, and the horizontal axis represents RL/L and RW/W.

It is shown in FIG. 12A that, in the case where the frequency of the main vibration was 31.25 MHz, the CI value was smaller than or equal to 50Ω when RW/W was in the range of 0.70 to 0.78 and RL/L was in the range of 0.66 to 0.74.

As can be seen from FIG. 12B, in the case where the frequency of the main vibration was 32.0 MHz, the CI value was smaller than or equal to 50Ω when RW/W was in the range of 0.67 to 0.79 and RL/L was in the range of 0.62 to 0.73.

From the above results, preferably, $0.62 \leq RL/L \leq 0.74$ is satisfied and $0.67 \leq RW/W \leq 0.79$ is satisfied, and more preferably $0.66 \leq RL/L \leq 0.73$ is satisfied and $0.70 \leq RW/W \leq 0.78$ is satisfied.

However, from FIGS. 12A and 12B, it is considered that the CI value can be sufficiently reduced even if RW/W is greater than 0.79 and RL/L is greater than 0.74. Therefore, in the case where the frequency of the main vibration of the quartz crystal blank 17 is 31.25 MHz or 32.0 MHz, the CI value can be sufficiently reduced if $0.62 \leq RL/L \leq 0.95$ and $0.67 \leq RW/W \leq 0.95$. The upper limit of RL/L and RW/W is set at 0.95 because, if RL/L and RW/W are greater than 0.95, the vibration energy of the main vibration of the quartz crystal blank 17 cannot be sufficiently confined in the region A1.

(Modification)

Figure 13:
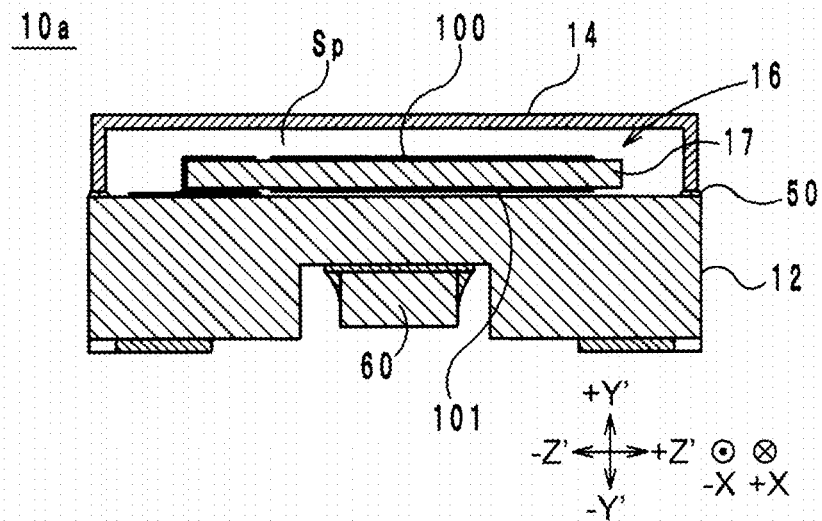
FIG. 13 is a sectional view of a quartz crystal resonator unit 10a according to a modification.

Hereinafter, a quartz crystal resonator unit 10a according to a modification will be described with reference to the drawings. FIG. 13 is a sectional view of the quartz crystal resonator unit 10a according to the modification.

As illustrated in FIG. 13, the quartz crystal resonator unit 10a according to the present modification includes a quartz crystal resonator 16 including a quartz crystal blank 17, and differs from the quartz crystal resonator unit 10 according to the embodiment described above in that a thermistor 60 is disposed on a back surface of a substrate 12. As the quartz crystal blank 17, a quartz crystal blank according to the embodiment described above can be used.

(Quartz Crystal Oscillator)

Figure 14:
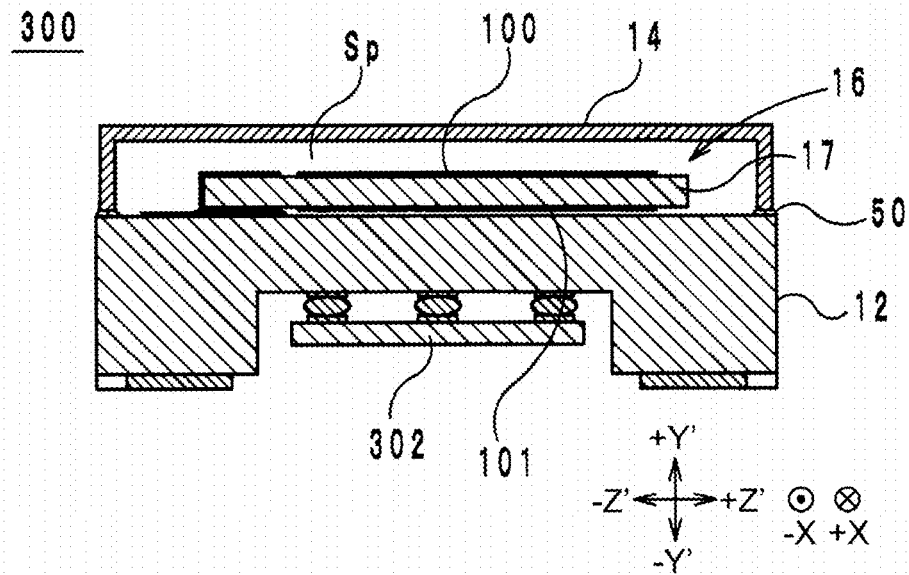
FIG. 14 is a sectional view of a quartz crystal oscillator 300.

Hereinafter, a quartz crystal oscillator 300 including a quartz crystal blank 17 will be described with reference to the drawings. FIG. 14 is a sectional view of the quartz crystal oscillator 300.

As illustrated in FIG. 14, the quartz crystal oscillator 300 includes a quartz crystal resonator 16 including the quartz crystal blank 17, and differs from the quartz crystal resonator unit 10 shown in FIG. 3 in that an IC 302 is mounted on a back surface of a substrate 12. As the quartz crystal blank 17, a quartz crystal blank according to the embodiment described above can be used.

Other Embodiments

A quartz crystal blank and a quartz crystal resonator unit according to the present invention are not limited to the quartz crystal blank 17 and the quartz crystal resonator unit 10, and may be modified within the scope of the present invention.

The quartz crystal blank 17 has a shape such that the thickness thereof decreases with increasing distance from the center of the front surface in the short-side direction and in the long-side direction. However, the thickness of the quartz crystal blank 17 may decrease with increasing distance from the center of the front surface in the short-side direction or may decrease with increasing distance from the center of the front surface in the long-side direction. That is, it is sufficient that the thickness of the region A2 and the thickness of the region A3 are smaller than the thickness of the region A1 and/or the thickness of the region A4 and the thickness of the region A5 are smaller than the thickness of the region A1.

Figure 15:
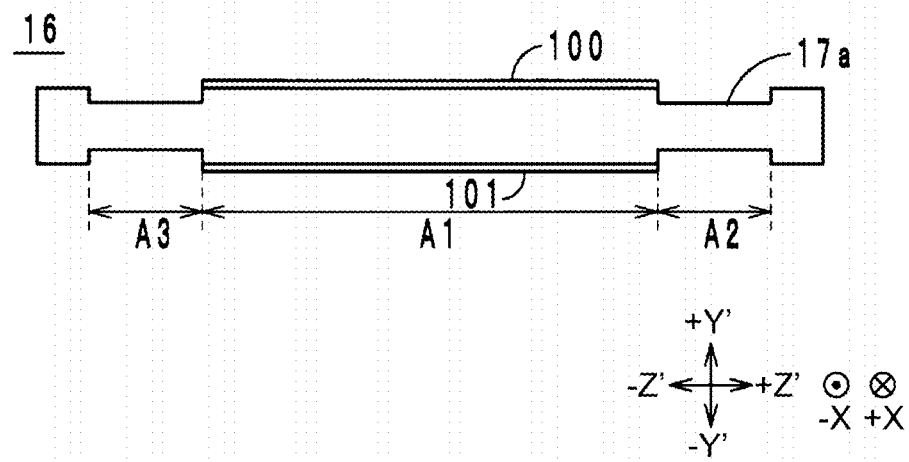
FIG. 15 is a sectional view of a quartz crystal blank 17a according to another embodiment.
Figure 16:
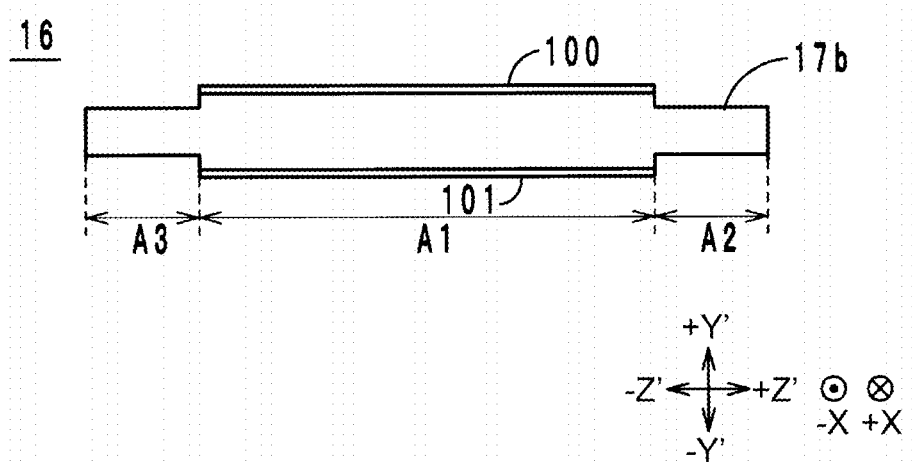
FIG. 16 is a sectional view of a quartz crystal blank 17b according to another embodiment.

FIGS. 15 and 16 are sectional views of quartz crystal blanks 17a and 17b according to other embodiments. As illustrated in FIG. 15, a region having a larger thickness than the region A2 may be disposed on the +Z' side of the region A2; and a region having a larger thickness than the region A3 may be disposed on the −Z' side of the region A3. Likewise, a region having a larger thickness than the region A4 may be disposed on the −X side of the region A4. A region having a larger thickness than the region A5 may be disposed on the +X side of the region A5. That is, as long as the region A2 to A5, each of which has a smaller thickness than the region A1, are disposed around the region A1, vibration energy of a main vibration is confined in the region A1. Therefore, other regions may be present or may not be present around the regions A2 to A5.

The regions A2 to A5, which have continuously-changing convex surfaces, may have concave surfaces or discontinuously-changing surfaces. That is, as illustrated in FIG. 16, the regions A2 to A5 may have step-like shapes.

As described above, the present invention can be used for a quartz crystal blank and a quartz crystal resonator unit and, in particular, advantageous in that the CI value can be reduced.

REFERENCE SIGNS LIST 10, 10a quartz crystal resonator unit
12 substrate
14 metal cap
16 quartz crystal resonator
17, 17a, 17b quartz crystal blank
21 substrate body
22, 26, 40, 42, 44, 46 outer electrode
30 metallized film
50 brazing alloy
60 thermistor
100, 101 excitation electrode
300 quartz crystal oscillator
A1 to A5 region

The invention claimed is:
1. An AT-cut quartz crystal blank comprising:
a quartz crystal body that is rectangular in shape in a direction normal to a main surface thereof, the quartz crystal body having a first region including a center of the main surface in the direction normal to the main surface, a second region and a third region that are adjacent to the first region on opposed sides thereof along a long-side direction in which long sides of the quartz crystal body extend, and a fourth region and a fifth region that are adjacent to the first region on opposed sides thereof along a short-side direction in which short sides of the quartz crystal body extend,
wherein the long sides of the main surface are substantially parallel to a Z' axis of the quartz crystal blank,
wherein the short sides of the main surface are substantially parallel to an X axis of the quartz crystal blank,
wherein a frequency of a main vibration of the quartz crystal blank is in a range of 30.5 MHz to 37.0 MHz,
wherein a thickness of the first region is substantially uniform,
wherein at least one of (1) a thickness of the second region and a thickness of the third region are smaller than the thickness of the first region, and (2) a thickness of the fourth region and a thickness of the fifth region are smaller than the thickness of the first region, and
wherein $16.21 \leq W/T \leq 17.71$, where W is a length of the first region, the fourth region, and the fifth region along the short-side direction, and T is the thickness of the first region.
2. The quartz crystal blank according to claim 1, wherein $16.58 \leq W/T \leq 17.25$.
3. The quartz crystal blank according to claim 1, wherein $17.12 \leq W/T \leq 17.22$.
4. The quartz crystal blank according claim 1, wherein the thickness of the second region and the thickness of the third region are smaller than the thickness of the first region, and the thickness of the fourth region and the thickness of the fifth region are smaller than the thickness of the first region.
5. The quartz crystal blank according to claim 1, wherein the thickness of the second region and the thickness of the third region are smaller than the thickness of the first region.
6. The quartz crystal blank according to claim 1, wherein the thickness of the fourth region and the thickness of the fifth region are smaller than the thickness of the first region.
7. The quartz crystal blank according to claim 4,
wherein the second region and the third region are positioned at opposed ends of the quartz crystal blank in the long-side direction, and
wherein the fourth region and the fifth region are positioned at opposed ends of the quartz crystal blank in the short-side direction.
8. The quartz crystal blank according to claim 7, wherein a thickness of the quartz crystal blank decreases with increasing distance from the center of the main surface along the long-side direction and decreases with increasing distance from the center of the main surface along the short-side direction.

9. The quartz crystal blank according to claim 7, wherein a thickness of the quartz crystal blank decreases with increasing distance from the center of the main surface along the long-side direction.

10. The quartz crystal blank according to claim 7, wherein a thickness of the quartz crystal blank decreases with increasing distance from the center of the main surface along the short-side direction.

11. The quartz crystal blank according to claim 7,
wherein $0.62 \leq RL/L \leq 0.95$, where L is a length of the first region, the second region, and the third region along the long-side direction, and RL is a length of the first region along the long-side direction, and
wherein $0.67 \leq RW/W \leq 0.95$, where RW is a length of the first region along the short-side direction.

12. The quartz crystal blank according to claim 11,
wherein $0.62 \leq RL/L \leq 0.74$, and
wherein $0.67 \leq RW/W \leq 0.79$.

13. The quartz crystal blank according to claim 11,
wherein $0.66 \leq RL/L \leq 0.73$, and
wherein $0.70 \leq RW/W \leq 0.78$.

14. A quartz crystal resonator unit comprising:
the quartz crystal blank according to claim 1.

15. The quartz crystal resonator unit according to claim 14, comprising:
a first outer electrode and a second outer electrode that are each arranged along a respective short side of the quartz crystal blank;
a substrate body; and
a third outer electrode and a fourth outer electrode that are each disposed on a respective main surface of the substrate body,
wherein the first outer electrode and the third outer electrode are electrically connected to each other, and the second outer electrode and the fourth outer electrode are electrically connected to each other.

16. The quartz crystal resonator unit according to claim 15, further comprising:
a cap disposed on the substrate body and covering the quartz crystal resonator.

\* \* \* \* \*